June 12, 1956 P. EISLER Re. 24,165

MANUFACTURE OF ELECTRIC CIRCUIT COMPONENTS Orig. 2,537,5[illegible]

Original Filed Feb. 3, 1944 7 Sheets-Sheet 1

Inventor
Paul Eisler
By
Daniel J. Meaney
Attorney

MANUFACTURE OF ELECTRIC CIRCUIT COMPONENTS

Original Filed Feb. 3, 1944 7 Sheets-Sheet 2

Inventor
Paul Eisler
By Dan J. Marcus
his Attorney

MANUFACTURE OF ELECTRIC CIRCUIT COMPONENTS

Original Filed Feb. 3, 1944 7 Sheets-Sheet 3

Inventor
Paul Eisler
By
Daniel J. Morris
Attorney

MANUFACTURE OF ELECTRIC CIRCUIT COMPONENTS

Original Filed Feb. 3, 1944 7 Sheets-Sheet 4

Inventor
Paul Eisler
By
Attorney

MANUFACTURE OF ELECTRIC CIRCUIT COMPONENTS

Original Filed Feb. 3, 1944 7 Sheets-Sheet 5

Inventor
Paul Eisler
By
Attorney

MANUFACTURE OF ELECTRIC CIRCUIT COMPONENTS

Original Filed Feb. 3, 1944 7 Sheets-Sheet 6

Inventor
Paul Eisler
By
Chas. Day Mauzy
Attorney

MANUFACTURE OF ELECTRIC CIRCUIT COMPONENTS

Original Filed Feb. 3, 1944 7 Sheets-Sheet 7

Inventor
Paul Eisler
By Dorf Manz
his Attorney

United States Patent Office

Re. 24,165
Reissued June 12, 1956

24,165

MANUFACTURE OF ELECTRIC CIRCUIT COMPONENTS

Paul Eisler, London, England, assignor to Hermoplast Limited, London, England, a corporation of Great Britain

Original No. 2,587,568, dated February 26, 1952, Serial No. 11,798, February 27, 1948, which is a division of Serial No. 520,991, February 3, 1944. Application for reissue February 25, 1954, Serial No. 412,671. In Great Britain February 2, 1943

Section 1, Public Law 690, August 8, 1946
Patent expires February 2, 1963

17 Claims. (Cl. 41—43)

Matter enclosed in heavy brackets [ ] appears in the original patent but forms no part of this reissue specification; matter printed in italics indicates the additions made by reissue.

This invention relates to the manufacture of electrical apparatus, and particularly to the production of electric circuits and parts thereof.

A principal purpose of the invention is to facilitate and cheapen quantity production of electric circuit components, such as the resistances, inductances, transformers, tubes, and interconnecting networks or circuit connections of radio apparatus, the windings of iron-cored transformers and dynamo electric machines, the connecting networks of switchboards, the conductors of heating appliances, and generally of any electrical circuit component which it may be convenient to manufacture by the methods herein disclosed.

A further purpose of the invention is to facilitate the production of electrical circuit components, even though they be not needed in great quantities, in which a high degree of precision is required in the dimensioning or relative location of conductors such as cannot readily be obtained by known means.

Yet another object of the invention is the production of surface heating elements in which the conductor also constitutes or carries an ornamentation.

Other objects of the invention will appear from the description following.

Most electrical components essentially comprise metal parts conducting electric current supported upon an insulating base, or with interposed insulation upon a metal base.

The invention consists in the production of the metal electric conductors in position upon their insulating support by a process based on the printing of a representation or pattern of the conductive metal.

The common way of building up an electrical circuit or circuit element is first to draw metal into wire, that is to say make a linear conductor, and afterwards to shape this conductor into coils and networks. By the application of the methods of the printing art the invention brings the metal conductor of the circuit component into existence in its final form, or in a development of that form upon a plane or cylindrical surface.

A typical instance of the invention comprises the steps of preparing by any of the well-known methods of the printing art, a printing plate for printing a representation of the metal electric conductors of the circuit component or a part of them; making an imprint by the aid of the printing plate upon a surface thereby differentiating on that surface the areas which are required to be conductive from the areas which are required to be non-conductive; and from that imprint producing the conductor by subjecting the printed surface to treatment which operates differently on the areas of the surface differentiated by the printing, thereby, changing the differentiation into a differentiation of conductive and non-conductive areas.

The development of the conductor from the imprint is in most cases effected by methods adapted from the printing art or analogous to the methods of the printing art, such as etching, bronzing, electro-deposition and the like.

The invention is explained hereinafter by a description of the production of various circuit components by its aid. This description refers to the accompanying drawings in which—

The diagram of connections or hook-up shown in Figure 1 forms no part of the invention, is substantially known, and therefore will not be described further than is necessary to assist the understanding of the later figures. It is seen to consist of valves $V_1$, $V_2$ etc., resistances $P_1$, $R_1$, $R_2$ etc., inductances such as L′, capacitances $C_1$, $C_2$, etc., an output transformer LS, and a network of conductors by which these other components are connected together. It is the production of the connecting network that will first be studied.

Figure 1:
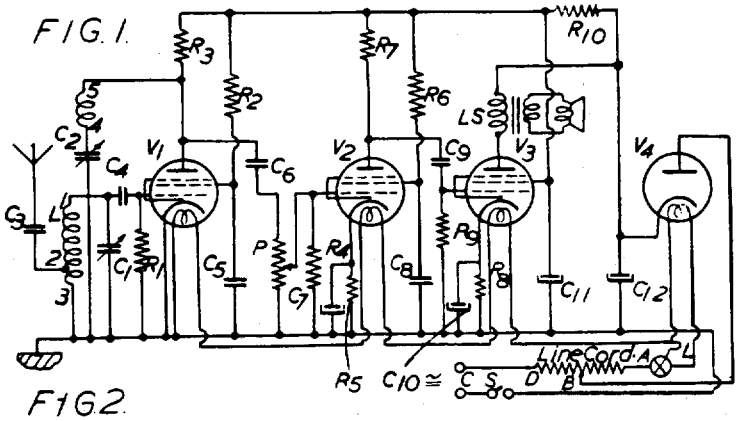
Figure 1 is a diagram of connections of a radio receiver.
Figure 2:
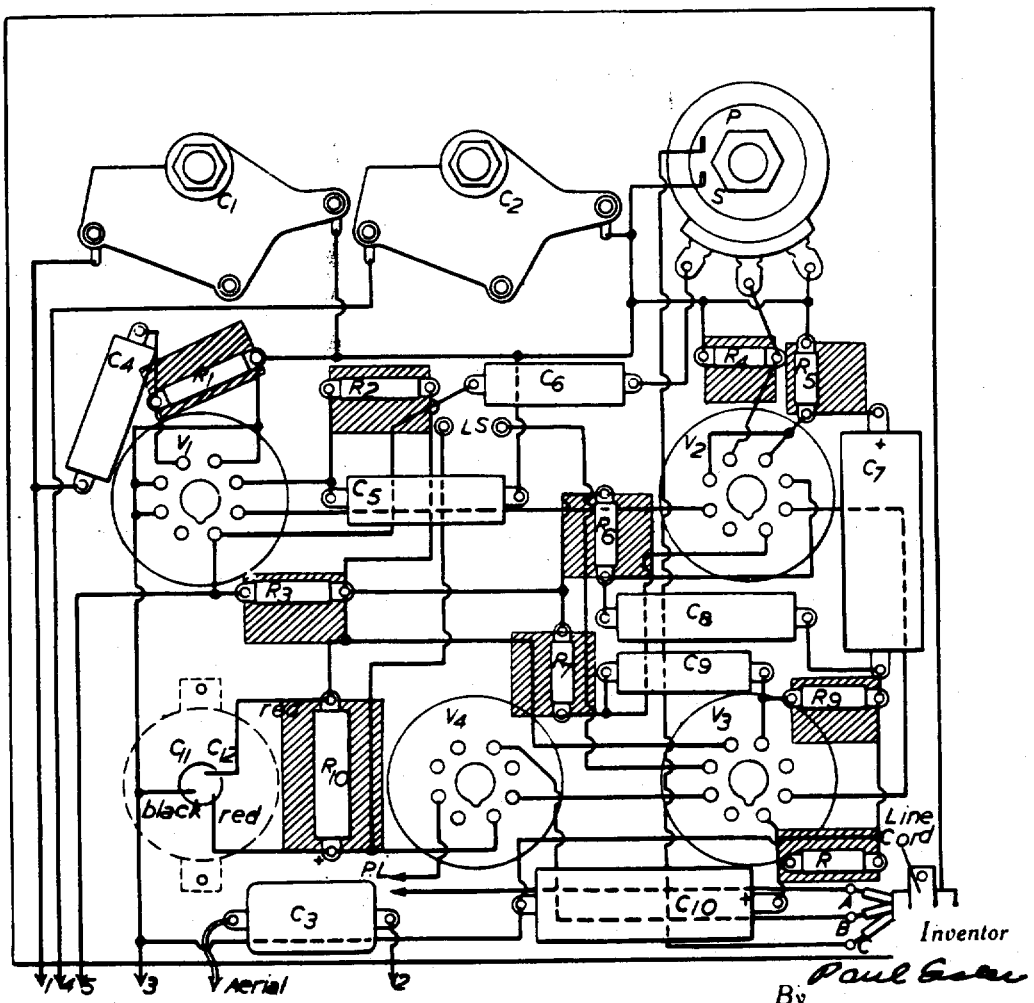
Figure 2 is a diagram showing the approximate lay-out of the components of this receiver.

The radio engineer charged with the manufacture of a radio receiver according to Figure 1, must first plan the lay out of the several components, including the connecting network, and produce a lay-out and wiring plan such as is shown in Figure 2. The design of this lay-out is again a matter for the radio engineer with which the present invention is not primarily concerned; though the radio engineer familiar with the present invention will naturally in planning his layout have regard to the fact that such and such components of it are to be made by the methods of the present invention. The correspondence between Figures 1 and 2 is sufficiently apparent from the references upon the several parts already mentioned.

It will be noted that the circuit connections shown in

Figure 2 involve several instances of crossing conductors; for instance the connection from LS to $V_3$ crosses the connection from $R_3$ to $V_3$. In wiring with pre-formed wires such connections are kept separate by suitable disposition in three dimensions; Figure 2 is not intended to represent such disposition; indeed some conductors are displaced to one side merely for the sake of clearness.

For the application of the invention to the manufacture of such a network it is manifestly convenient for the connections to be disposed in one plane; but if they cannot be so disposed without crossings it will be convenient to dispose them in two or three or more planes; so making the network two or more circuit components which are printed separately or side by side and afterwards assembled in superposition or other desired relation and connected together where necessary.

Figure 3:
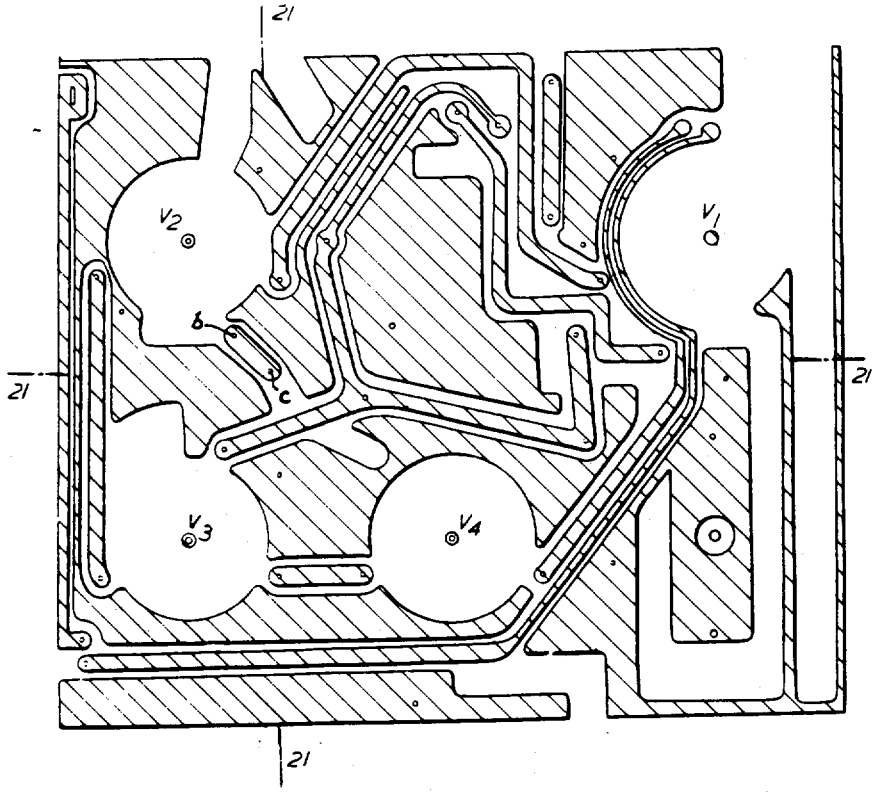
Figures 3 and 4 show two part schemes of connections prepared for the purpose of applying the invention to the manufacture of the circuit connections of this receiver.
Figure 4:
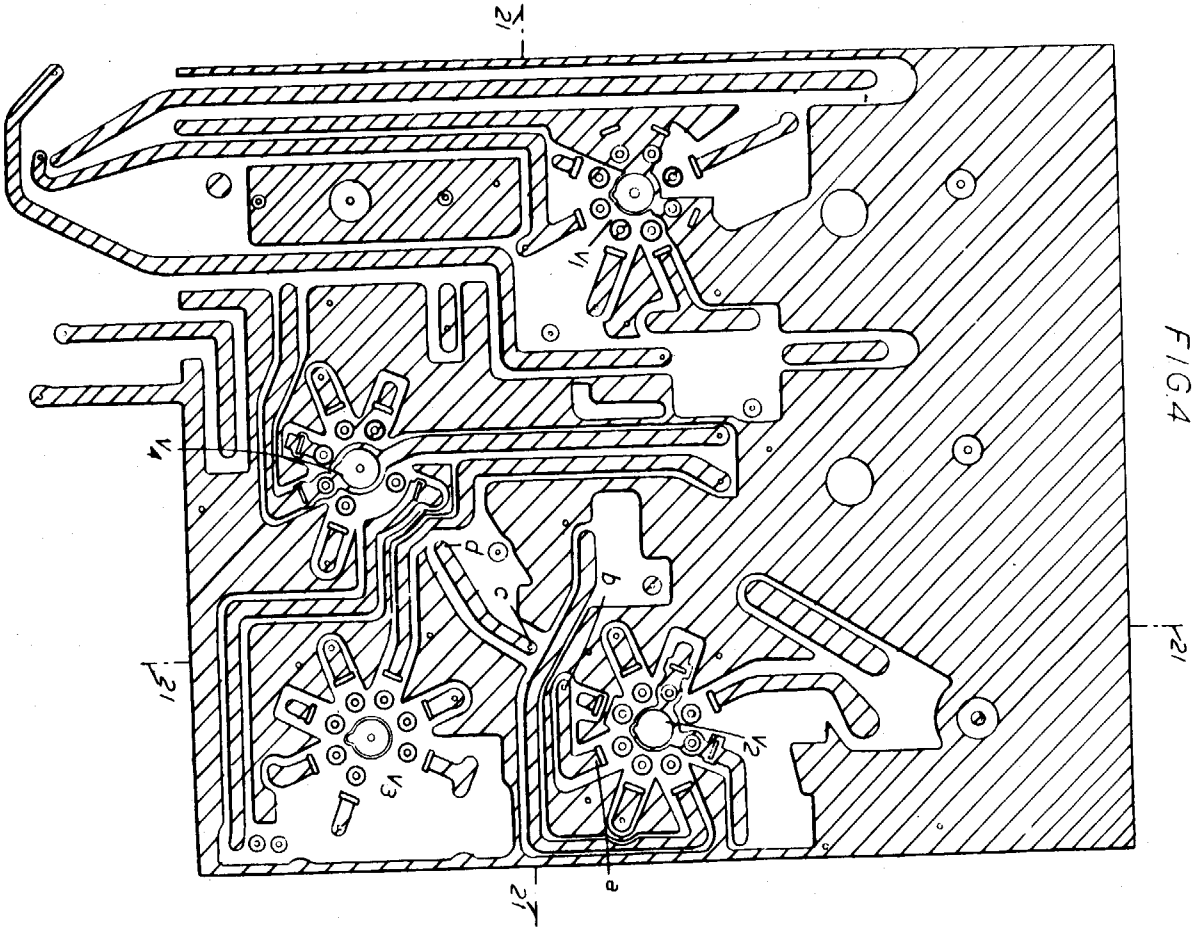

In the present instance the whole of the circuit connections can conveniently be set out in two planes, and they are shown so set out in Figures 3 and 4. The general resemblance of Figures 3 and 4 to the lay-out plan of Figure 2 can be seen at a glance, and the location of various components other than the network itself can readily be recognised. For example, $V_1$, $V_2$, $V_3$ and $V_4$ in Figures 3 and 4 mark the location in the network of the tubes or valves indicated by those references in Figures 1 and 2. It will be seen that if Figure 4 be directly superposed on Figure 2 the valves, or rather valve holders, indicated in the latter figure come in the places to which valve connections converge in Figure 4. Figure 3 will similarly register with Figure 2 and with Figure 4 if turned face downward. If the correspondence of these figures be studied in detail it will be seen that some conductors shown in Figure 2 appear in part in Figure 3 and in part in Figure 4; for example the connection between $V_2$, $C_9$ and $R_7$ in Figure 2 is represented by the connection a, b from the position of $V_2$ in Figure 4, the connection b, c in Figure 3, and the connection c, d in Figure 4. Provision has to be made for joining these connections into one conductor in the finished articles; for this reason the parts of it are drawn so that their ends overlap when Figures 3 and 4 are superposed back to back; thus the points b and c of Figure 4 overlap and register with the points b and c of Figure 3.

To make possible the employment of universal tools, as hereinafter described, in the manufacture of various schemes of connections, of which Figures 1 and 2 are only one example, it is convenient to limit the possible positions of junction points such as b and c. For this reason it is of advantage to prepare the drawings of the part schemes, Figures 3 and 4, by the aid of squared tracing paper and to arrange that every junction joint falls upon an intersection of the lines of the grid. It would only confuse Figures 3 and 4 to superpose such a grid upon them; two lines of the grid are indicated by the chain lines 21 passing through the point c in both Figures 3 and 4.

From the drawings, Figures 3 and 4, printing plates are prepared by any of the usual methods of the printing art. These printing plates may, for example, be engravings on metal, or lithographic stones, or they may be prepared by any usual photomechanical process, or they may be photographic plates. The printing plates so produced may be in relief, in intaglio, or planographic, according to the method of production.

From the two printing plates so produced any desired number of identical prints of the circuit component may be made.

In one form of the invention, convenient for the instance under consideration, the prints are made upon a composite material consisting of metal foil upon an insulating backing. The thickness and nature of the foil and of the backing depend upon the particular process chosen for converting the imprint of the circuit component into a circuit component. Metallised or metal-coated paper is one material; it is preferable to impregnate the paper with an acid-resisting varnish made of a suitable plastic. Or metal foil may be coated with varnish or with a layer of plastic of the desired thickness. Or a metal coating may be applied to a pre-formed sheet of insulating material, such as a plastic. Zinc, aluminium, and copper may be named among suitable metals.

For the purpose of the particular example of the invention now under consideration the print is made with an acid-resistant ink upon the metal side of such composite material. Except where the pattern to be printed is very fine it is an advantage to impart a grain to the metal surface by use of an etching bath, or by abrasion or otherwise, prior to printing. The print may be made directly from the printing plate or by the off-set method. To ensure a print free from pinholes, the print may be overprinted, or otherwise reinforced. The print is naturally identical with Figures 3 and 4, and those Figures equally represent the drawing from which the printing plate was prepared, and the print made from the plate upon the metal surface of a composite sheet.

The part circuit components are next perforated at all the points at which junction has to be made between the conductors of the sheet corresponding with Figure 3 and those on the sheet corresponding with Figure 4, that is to say at all points such as c. The restricted location of such junction points as above described enables all the perforations, whether for these particular components or for any other circuit components of like area, to be made by a universal punching tool in which pin punches can be inserted at any of a large number of positions corresponding with the intersections of the grid employed in preparing Figures 3 and 4. If there are large areas of metal to be removed they may be punched out prior to etching, for instance simultaneously with the perforation, so as to even up the extent of etching necessary all over the print.

The sheet is then etched in the well-known manner of the printing art, in a bath suited to the particular metal employed, but with this difference from the usual etching of a printing process that the metal not protected by the resistant ink is wholly etched away. To permit of this complete etching away without undue undercutting of the protected parts it may be convenient, as is commonly done in preparing printing plates, to interrupting the etching and recoat the surface, for instance with a fatty ground, which can be made to protect the sides of the etched lines as well as the outer surface. When etching is complete the ink may be washed off.

It will be clear that Figures 3 and 4 equally represent the etched print, that is to say they may be regarded as depicting a sheet of insulating material coated with metal over the shaded parts only.

Figure 5:
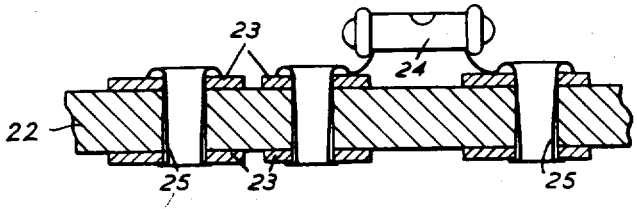
Figure 5 is a cross-section illustrating the making of connections between one part scheme of connections and another and between the circuit leads and a component by means of an eyelet.
Figure 6:
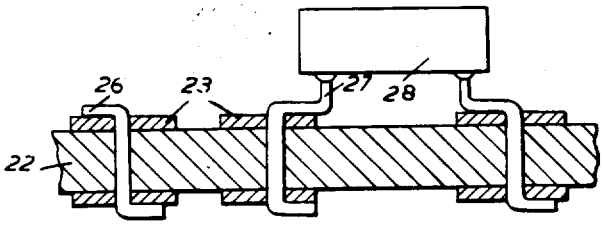
Figure 6 is a cross-section illustrating the making of connections between one part scheme of connections and another and between the circuit leads and a component by means of stitching wire.

The two part circuit components are now superposed back to back and metallic junctions are made between them at all the perforations. Such conections may be made in the manner now common in the radio art by means of eyelets. Figure 5, for example, shows a cross-section of a small portion of an insulating sheet 22, having conductors 23 on each side of it produced by printing methods such as that above described or those described hereinafter, and the conductors on one side are joined to conductors on the other side, and to the terminal tags of other circuit components such as the resistance 24, by eyelets or hollow rivets 25. Or such connections may be made by wire stitching, using wire staples, or wires bent twice at right angles into S form as seen at 26 in Figure 6, and the terminal wires 27 of a component such as the fixed capacitance 28 of Figure 6 may be used for such stitching. The eyelets or wires are preferably tinned and solder-painted, so that the joints may subsequently be perfected by soldering. This operation also may be performed by a heated universal tool in which soldering bits are set at the position of the junctions of the circuit component in course of manufacture. If desired the metal may be protected and insulated by a coating of varnish except over points required to be accessible for purposes of testing or the making of further connections.

The circuit may be tested by a universal testing appliance which permits of contacts being set in desired positions on a surface.

If desired a single printing plate may reproduce the two representations, Figures 3 and 4, side by side, on the same composite sheet. In that case the conductors developed from the print are superposed by folding the sheet back upon itself with the conductors outward.

It will be seen that the essence of the particular method of producing circuit components just described is the preparation of a printing plate, the printing from it of a representation of the conductors of the circuit component, thereby differentiating on the printing surface the areas which are required to be conductive from those which are required to be non-conductive, and the subjecting of the surface to an after treatment which operates differently on the differentiated parts and converts the differentiation into a differentiation of conductive and non-conductive areas. The imprint made is a positive imprint, that is to say the inked part represents the conductors of the component; and the imprint is made on metal; and the component is completed by removal of metal from the unprinted areas.

In the particular method just described removal of metal was effected by chemical etching; it could equally well be removed by electrolysis, the printed surface being made the anode in a bath of electrolyte which attacks the foil. In the case of some metal foils, for example aluminium, it may be convenient, instead of removing them wholly, to convert them into non-conductors, a process well-known as "anodising," and which also consists essentially in making the metal an anode in a suitable electrolytic bath.

Instead of producing the circuit component from the imprint by removal of metal it may be produced by adding metal. For example, the printing plate may be prepared to print a negative of the circuit component, that is to say to cover with ink those parts of the surface which are to be non-conductive. A negative imprint can be made in insulating ink upon metal foil say zinc foil, on a suitable backing, and additional metal of a different kind, say copper, can be added to the parts not inked by electro-deposition, the printed foil being made the cathode in an electrolytic bath. Or the printed foil may be subjected to a galvanising process by coating it with flux and passing it through a bath of molten metal, which must naturally be a metal of low melting point such as Rose metal or a soldering alloy, melting at a temperature which will not harm the insulating backing. The metal foil must subsequently be removed, at least over those areas covered by the ink and therefore not covered by added metal, and this may readily be done in an acid bath which attacks the metal of the foil but not the added metal.

The printing plate may be a photographic plate or film, in which case the imprint is made by contact printing or projection upon a sensitized surface. For example a metal plate may be gelatine coated as in zincography, and printed from a negative of the circuit component. The coating is hardened where it is exposed to light and elsewhere may be washed away, and the metal so uncovered can be etched away, preferably in stages. Or the hardened gelatine may be inked and dusted.

These various methods by which an imprint of a circuit component is converted into a circuit component are to be regarded as illustrative examples only; to those acquainted with the printing art, from which most of the individual steps employed are taken, with some modification, it will be obvious that many other modified operations or modified sequences of operations may be adopted according to the nature of the circuit component that is to be made. A few of these are mentioned below in connection with the making of particular circuit components.

Reverting to the radio receiver of Figures 1 and 2, there has so far been described the production of only one of its circuit components, namely the circuit connections, which can be produced by any of the methods above described. To what extent it is convenient to employ the invention in the making of other components of the radio receiver is a question to be answered on economic grounds. The illustrative examples next described show that other components may readily be made by similar methods, and those examples will assist in indicating how the design of components may usefully be modified with a view to their being manufactured by a printing process.

Figure 7:
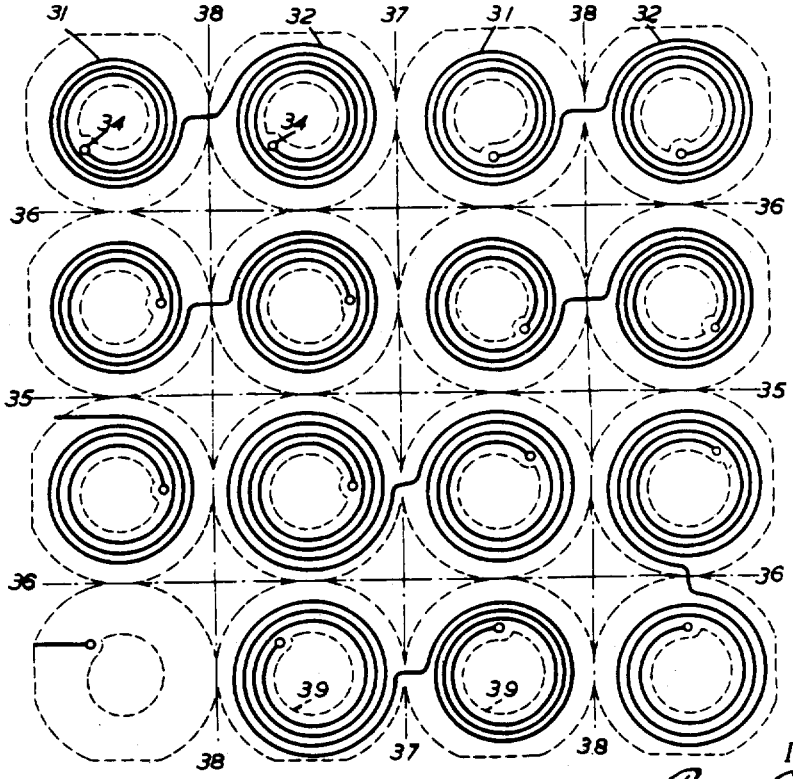
Figure 7 is a pattern of flat spirals illustrating the making of inductance coils according to the invention by printing with the additional step of folding.

The inductance L′ of the antenna circuit may take the well-known if less usual form of a flat spiral, such as one of the spirals 31 of Figure 7. On account of exigencies of drawing the spiral is shown as consisting of a few well spaced turns; the printing methods above described, particularly, for example, the method of printing and etching first above described, permits of the making of a spiral of hundreds of turns spaced apart no more than a few thousandths of an inch. Hence a single spiral will commonly suffice for the inductance L′. The spiral is drawn out carefully, a printing plate is made from the drawing, an imprint is made on metal foil, on an insulating backing, and the metal not protected is etched away; or another of the procedures above described is followed.

Figure 8:
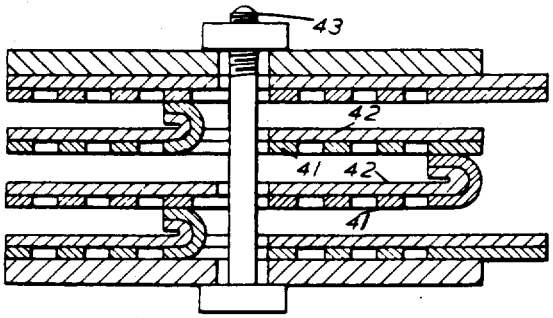
Figure 8 illustrates another way of joining parts of a component.

If greater inductance is required than can conveniently be obtained in a single spiral, for example if a winding of a great number of turns is required with or without an iron core, the spiral pattern may be repeated as often as desired. A convenient pattern is that shown in Figure 7, which consists of pairs of spirals 31, 32, joined at their outer ends. The free ends of the spirals form junction points 34, and it will be noted that some of these, but not all, have the same angular position as each other; for example no two of the spirals in the second row have their free ends in the same position, but each of them has its free end in the same position as has the spiral beneath it in the third row. This pattern may be printed on metal on an impregnated paper backing which can readily be folded. After the print has been metallised in one of the ways above described and its surface coated (or left coated) with insulation, except at the junction points, the sheet is folded about the line 35—35. The junction points become superposed in register and may be connected by spot-welding by a universal welding tool analogous to the soldering tool above mentioned. Or they may be joined as explained with reference to Figures 5 and 6. After the junctions have been made the print is further folded about the lines 36—36, the lines 37—37 and the lines 38—38. By a small modification in the pattern, junction points may be made to abut upon one another on folding, as shown in Figure 8, which is a cross section of several spirals 41 on insulating sheets 42, the inner or outer end of each spiral being folded to abut on the inner or outer end of its neighbour; the spirals are held together by the bolt 43 which exerts sufficient pressure to make a metallic connection at the points of abutment. If an iron core is to be used the centres of the spirals of Figure 7 are punched out along the dotted lines 39 before folding, and the insulation between spirals may also be punched out as indicated by the dotted circles surrounding the spirals.

Figure 9:
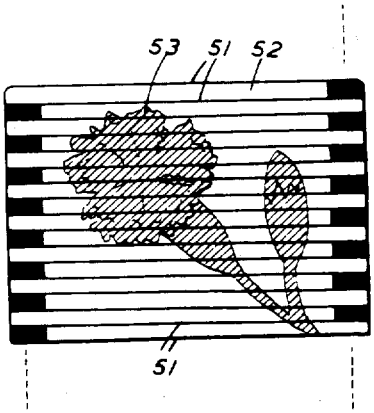
Figure 9 illustrates a printed pattern of parallel conductors having many useful applications.

Figure 9 may be referred to here as illustrating a pattern of parallel linear conductors 51 upon an insulating ground 52, a pattern which may readily be produced by the method of the invention and which is the foundation of several varieties of circuit components. It will be seen that at each end of the pattern all the lines are joined so that electrically they are in parallel. In addition alternate pairs of lines 51 are joined further from the edge of the pattern so that if the extreme edges are sheared off the lines will be electrically in series. Again it is to be noted that exigencies of drawing make Figure 9 highly diagrammatic; in fact the pattern can be of enormously greater length, and be composed of a very great number of closely spaced lines. Figure 9 will be further described below. It is mentioned here as completing the illustration of the circuit component shown in Figure 10. In this Figures 55 and 56 show the two ends of a long strip of flexible insulation bearing a pattern of parallel metallic lines, such as is illustrated in Figure 9, but in this case without any end connections between the lines. This pattern is here used as the basis for making a helical winding to serve as an inductance, or as the winding of a transformer or for like purposes. After printing and development of the metallic lines the strip is wound upon a former or upon a core and closed. It would ordinarily be a very tedious operation to wind a wire winding upon a closed core, perhaps involving threading the bobbin through the core same thousands of times. But when it is remembered that the strip of Figures 9 and 10 may have hundreds of conductors side by side, it will be understood that thousands of turns of wire may be wound about a core by threading such a strip through it only a few times. However, the winding of the strip on the core in this manner only leaves the core winding with, say, a thousand separate conductors each encircling the core a few times. It remains to join these conductors in-series, which involves, say, joining the end of the lowermost conductor in the end 55 of the strip to the uppermost in the end 56 and so on. This is conveniently done by the aid of a label 57 of transparent insulating material bearing a pattern of parallel conductors of similar spacing to the conductors of the strip 55, 56 insulated at their middle parts but bare and solder-painted at their ends. In order that this label may be accurately applied to the ends 55, 56, as is necessary considering the close spacing of the conductors, the label is not only printed but embossed, preferably in the printing operation, so that the ends of its conductors lie in grooves. Figure 11 shows a section of the label 57 and of the end 56 upon the lines XII—XII of Figure 10, and shows the end of the label superposed upon the end of the strip. It will be seen that the embossed parts of the label will fit between the conductors of the strip and thereby cause the conductors of strip and label to be accurately superposed. A soldered joint is made by heat and pressure. The flaps 58 of the label may be coated with adhesive and folded around and made adherent to the back of the ends 55, 56.

Figure 10:
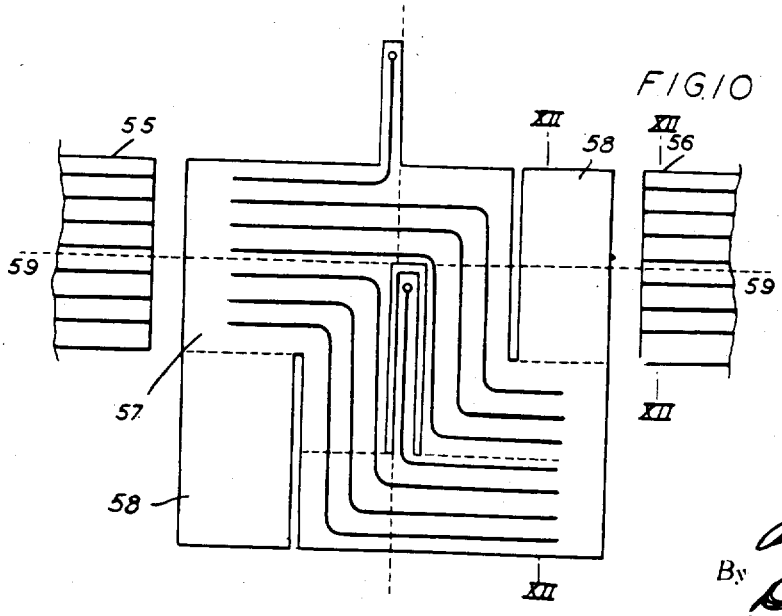
Figure 10 is a pattern of lines on a principal sheet and a connector label illustrating the making of a helical inductance coil according to the invention by printing with the additional steps of winding the principal sheet and attaching a connector label.
Figure 11:
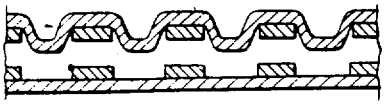
Figure 11 is a section of a helical inductance and its label showing how the label is positioned by embossing.
Figure 12:
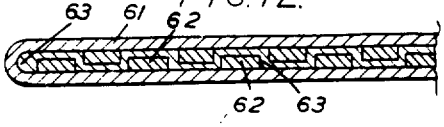
Figure 12 illustrates a modification of the pattern of parallel lines.

If it is desired to have parallel conductors upon a strip such as that of Figure 9, or the strip 55, 56 of Figure 10, more closely spaced than lines can reliably be printed, the spacing of the lines may be increased to a little more than the width of the lines, and after printing and metallising the lines may be varnished with plastic. The strip can then be folded about a mid line (59, 59, Figure 10), running lengthwise of it, so that the conductors of one half of the strip come to lie between those of the other half; this is seen in Figure 12 which is a cross-section of such a folded strip, 61 being the insulating backing, 62 the conductors, and 63 their insulating coating.

Figure 13:
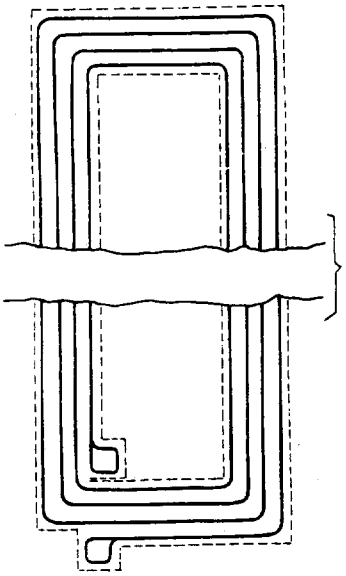
Figures 13 and 14 illustrate the making of an inductance from a pattern of rectangles with the additional steps of twisting and winding on a double core.
Figure 14:
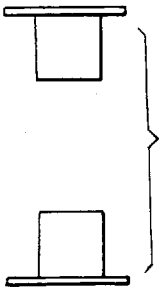

Figures 7, 10 and 11 illustrate different ways in which the electro-conductive part of a circuit component originally printed on a flat sheet, or maybe on a cylinder, may be deformed into a three dimensional structure; Figures 13 and 14, showing an alternative way of building a cylindrical coil, for instance a relay winding, illustrate a third kind of deformation. In this case the printed pattern consists of a great number of elongated approximately rectangular turns one within the other; the middle part of the figure is broken away to indicate that its length may be large compared with its width. When this is metallised the conductor is continuous from end to end. It is formed into an inductive winding by stamping out its middle as indicated by the dotted line and winding it on the two-part core or former shown in Figure 14, preferably so that its ends become superposed, and then turning one part of the core or former end for end, thereby twisting the ends of the rectangular pattern, and bringing its long sides into juxtaposition with the current traveling around the core in the same direction in all of them.

The invention is by no means confined to the building of circuit components for radio receivers. The pattern of parallel lines described with reference to Figure 9 is a typical pattern for the production of electrical resistances, for example for all kinds of heaters.

A resistant conductor such as indicated in Figure 9 may be formed upon wall-papers, wall and furniture panels, curtains, and other hangings, and the like for the purpose of making electric heaters or rather warmers of them. Such a conductor, though of small thickness, will carry a substantial current because its flat form promotes loss of heat by radiation and conduction. The conductor will be insulated and protected by a covering, for instance of a varnish or plastic on which powdered metal oxide may be dusted to increase radiation; in the case of aluminium the conductor is preferably covered by oxidation for the same reasons.

When used on ordinarily ornamental fabrics such as wall-papers the pattern of Figure 9 may be made to provide or contribute to the ornamentation by a double printing process. There is first produced a pattern of parallel lines of say, aluminium, copper, zinc, iron or nickel. Upon this any ornamental design 53 is printed in an insulating ink. The sheet is then made the cathode in an electrolytic bath by which copper is deposited on the metal lines except where covered by ink. The final product is, as before, a sheet with a pattern of parallel lines of which those parts within the design are of higher resistance than the remainder. Alternatively the over-printed sheet may be anodised to bring about reduction in the cross-section of the unprotected parts.

However, the second pattern may be super-posed merely for its appearance without any thought of making the pattern rather than the non-patterned part of the source of heat, or vice versa. In this case it may be desired to render the pattern of parallel lines inconspicuous to the eye, by suitable dyeing of the base, or of the oxide-coated or otherwise insulated conductor. For such over-printing a pattern of parallel lines of aluminium may be used with advantage, and the sheet subjected to an anodising process and dyeing process by which effects of some beauty may be produced. By the use of dyes which change colour at a temperature above atmospheric and below that which the conductor, or a part of it, reaches when carrying current, a visual indication may be given when the heat is on. Such substances are well known in the art.

Figure 15:
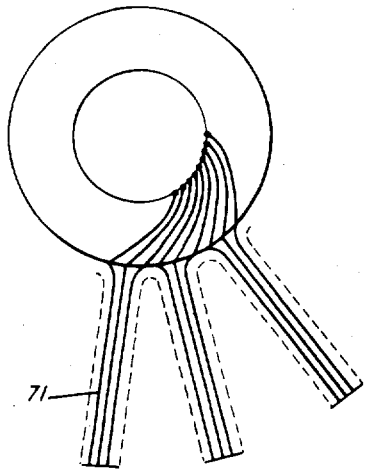
Figures 15, 16 and 17 illustrate the application of the invention to the printing of the conductors of dynamo-electric machines.
Figure 16:
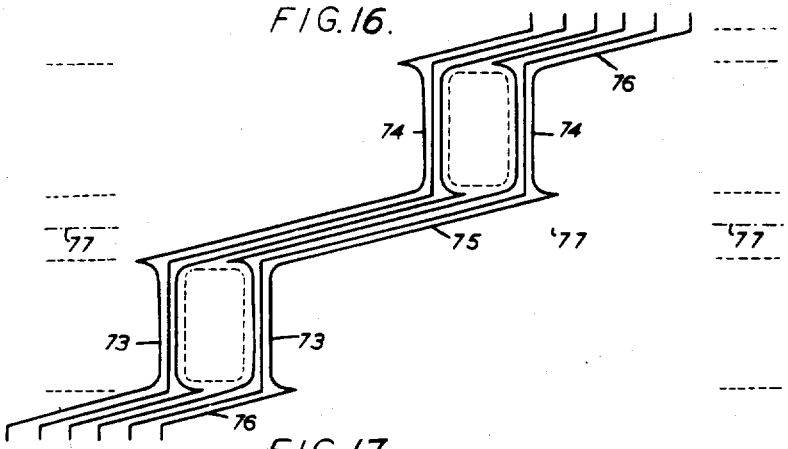

A class of printed patterns deserving mention is the patterns for winding the toothed cores of dynamo-electric machines. In one form shown in Figure 15 the pattern is mainly a star, in which each ray is a group of parallel conductors 71 representing the conductors of one slot; the inner and if desired the outer ends of the rays are prolonged at an angle to their length to form end connections preferably of the form of involutes of a circle; the insulating material between the groups of slot conductors is removed as indicated by the doubled lines, so that the slot conductors may be folded through a right angle to enter the slots. Or the slot conductors may appear in the pattern as parallel groups of parallel lines 73 (as seen in Figure 16) upon an insulating sheet which is to be wrapped around the slotted core, openings being punched between the slot conductors, as indicated by the dotted rectangles, for the passage of the teeth. The end connections may be brought into their proper relative position by folding of the insulating sheet. For example the pattern may consist of two rows of groups of parallel lines 73, 74, those of one row being joined to those of the other by other parallel lines 75 at an inclination to the groups, while the outer ends 76 of the group are prolonged at the same inclination. By folding this pattern about a line 77 at right angles to and mid-way between the groups, the latter are superposed in the same slots or made to lie side by side in neighboring slots, while the inclined lines 75 and 76 become end connections of V form. The rectangular openings punched in the insulating sheet between the groups, as indicated by dotted lines encircle the teeth when the winding is placed on the core.

Figure 17:
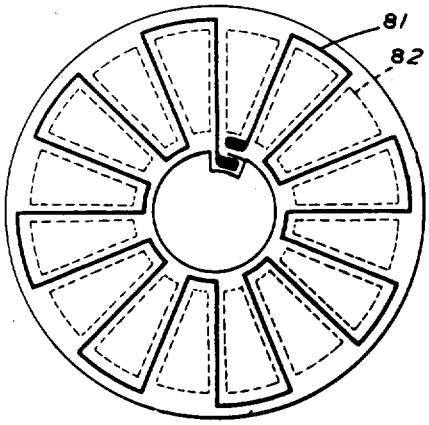

The invention is more readily applicable to dynamoelectric machines employing an armature of disc form or consisting of a plurality of discs, as in some types of multipole alternator and inductor alternator. One such disc is shown in Figure 17. The conductor 81 has its radial turns spaced a pole pitch apart, or in the case of the inductor a tooth pitch apart. The ground upon which the print is made and the metal built up may be stamped out as indicated by the dotted line 82.

This application is a division of my application Serial No. 520,991, filed February 3, 1944, now Patent No. 2,441,960, granted May 25, 1948.

I claim:

1. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing a sheet of metal foil with an impervious insulating backing, printing a representation on the surface of the metal foil of the conductive pattern of the component, including junction points which register with said metallic joints, in a medium adherent to said foil and protecting it from chemical attack on the areas of said pattern, subjecting the metal foil to a chemical action utilizing the differentiation resulting from the imprint to produce a differentiation of conductive and nonconductive parts of the metal foil, and making electric connections at said junctions.

2. A method of manufacturing a component of an electric circuit according to claim 1 wherein the printed metal foil is subjected to the chemical attack of an etching fluid and the metal not covered by the protective medium is completely dissolved.

3. A method of manufacturing a component of an electric circuit according to claim 1 wherein the printed metal foil is subjected to the chemical action of an electrolytic bath and made an electrode in the electrolytic circuit to produce a differentiation of conductive and nonconductive parts of the metal foil.

4. A method of manufacturing a component of an electric circuit according to claim 3 wherein the metal foil is made the anode in the electrolytic bath and the metal on the unprotected areas of the foil dissolved.

5. A method of manufacturing a component of an electric circuit according to claim 3 wherein the metal foil is made the anode in an anodizing bath and the metal on the unprotected areas of the foil is anodized throughout its thickness.

6. A method of manufacturing a component of an electric circuit according to claim 1 including the additional steps of deposition of metal upon at least selected parts of the metallic foil pattern of the component.

7. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing two sheets of metal foil with an impervious insulating backing between them, printing a representation on the exposed surface of one of the sheets of metal foil of a portion of the conductive pattern of the component, including junction points which register with said metallic joints, in a medium adherent to said foil, printing a representation of another portion of said conductive pattern on the exposed surface of the other sheet of metal foil in a similar medium and protecting said foil from chemical attack on the printed areas of said pattern, subjecting the metal foil on the opposite sides of said backing to a chemical action utilizing the differentiation resulting from the imprints to produce a differentiation of conductive and non-conductive parts of the metal foil, and making electric connections at said junctions.

8. A method of manufacturing a component of an electric circuit according to claim 1 including the additional step of increasing the electrical resistance of selected portions of the metal foil conductors of the pattern by exposing said portions to chemical action of a liquid thereby reducing the metallic cross-section of said conductors.

*9. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing a sheet of metal foil with an impervious insulating backing, printing by means of engraving on a plate a representation on the surface of the metal foil of the conductive pattern of the component, including junction points which register with said metallic joints, in a medium adherent to said foil and protecting it from chemical attack on the areas of said pattern, subjecting the metal foil to a chemical action utilizing the differentiation resulting from the imprint to produce a differentiation of conductive and non-conductive parts of the metal foil and making electric connections at said junctions.*

*10. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing a sheet of metal foil with an impervious insulating backing, printing by means of a lithographic stone a representation on the surface of the metal foil of the conductive pattern of the component, including junction points, which register with said metallic joints, in a medium adherent to said foil and protecting it from chemical attack on the areas of said pattern, subjecting the metal foil to a chemical action utilizing the differentiation resulting from the imprint to produce a differentiation of conductive and non-conductive parts of the metal foil and making electric connections at said junctions.*

*11. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing a sheet of metal foil with an impervious insulating backing, printing by the off-set method a representation on the surface of the metal foil of the conductive pattern of the component, including junction points which register with said metallic joints, in a medium adherent to said foil and protecting it from chemical attack on the areas of said pattern, subjecting the metal foil to a chemical action utilizing the differentiation resulting from the imprint to produce a differentiation of conduc-*

*tive and non-conductive parts of the metal foil, and making electric connections at said junctions.*

*12. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing two sheets of metal foil with an impervious insulating backing between them, printing by means of engraving on a plate a representation on the exposed surface of one of the sheets of metal foil of a portion of the conductive pattern of the component, including junction points which register with said metallic joints, in a medium adherent to said foil, printing by means of engraving on a plate a representation of another portion of said conductive pattern on the exposed surface of the other sheet of metal foil in a similar medium and protecting said foil from chemical attack on the printed areas of said pattern, subjecting the metal foil on the opposite sides of said backing to a chemical action utilizing the differentiation resulting from the imprints to produce a differentiation of conductive and non-conductive parts of the metal foil, and making electric connections at said junctions.*

*13. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing two sheets of metal foil with an impervious insulating backing between them, printing by means of a lithographic stone a representation on the exposed surface of one of the sheets of metal foil of a portion of the conductive pattern of the component, including junction points which register with said metallic joints, in a medium adherent to said foil, printing by means of a lithographic stone a representation of another portion of said conductive pattern on the exposed surface of the other sheet of metal foil in a similar medium and protecting said foil from chemical attack on the printed areas of said pattern, subjecting the metal foil on the opposite sides of said backing to a chemical action utilizing the differentiation resulting from the imprints to produce a differentiation of conductive and non-conductive parts of the metal foil, and making electric connections at said junctions.*

*14. A method of manufacturing a component of an electric circuit involving a conductive pattern of such weak mechanical structure that it is incapable of self-maintaining its configuration, said component including at least one conductor linking at least two terminals of said electric circuit of different operating potentials and including metallic joints for at least one other electric device not contained within said component, which comprises providing two sheets of metal foil with an impervious insulating backing between them, printing by the off-set method a representation on the exposed surface of one of the sheets of metal foil of a portion of the conductive pattern of the component, including junction points which register with said metallic joints, in a medium adherent to said foil, printing by the off-set method a representation of another portion of said conductive pattern on the exposed surface of the other sheet of metal foil in a similar medium and protecting said foil from chemical attack on the printed areas of said pattern, subjecting the metal foil on the opposite sides of said backing to a chemical action utilizing the differentiation resulting from the imprints to produce a differentiation of conductive and non-conductive parts of the metal foil, and making electric connections at said junctions.*

*15. A method according to claim 1, in which said medium is applied to the foil surface in the printing of said representation.*

*16. A method according to claim 1, in which said representation of the conductive pattern is printed on the foil surface by transferring said medium to the foil surface from a printing plate.*

*17. A method according to claim 1, in which said representation of the conductive pattern is printed on the foil surface by transferring said medium to the foil surface from a photographically prepared printing plate.*

References Cited in the file of this patent or the original patent

UNITED STATES PATENTS

| | | |
|---|---|---|
| 1,582,683 | Harmon | Apr. 27, 1926 |
| 1,623,666 | Ferkel | Apr. 5, 1927 |
| 1,647,474 | Seymour | Nov. 1, 1927 |
| 1,777,353 | Davis | Oct. 7, 1930 |
| 2,137,456 | Palm | Nov. 22, 1938 |
| 2,166,366 | Norris | July 18, 1939 |
| 2,166,367 | Norris | July 18, 1939 |
| 2,205,466 | Caprio et al. | July 25, 1940 |
| 2,261,473 | Jennings | Nov. 4, 1941 |
| 2,288,735 | O'Connell | July 7, 1942 |
| 2,379,459 | Schreiber | July 3, 1945 |
| 2,432,800 | Reichold | Dec. 16, 1947 |
| 2,441,960 | Eisler | May 25, 1948 |
| 2,443,119 | Rubin | June 8, 1948 |
| 2,506,604 | Lokker et al. | May 9, 1950 |

FOREIGN PATENTS

| | | |
|---|---|---|
| 327,356 | Great Britain | Apr. 3, 1930 |
| 670,106 | Germany | Jan. 11, 1939 |